(12) United States Patent
Kim et al.

(10) Patent No.: US 8,952,410 B2
(45) Date of Patent: Feb. 10, 2015

(54) LED LENS AND LED PACKAGE USING THE SAME

(71) Applicant: Samsung Electronics Co., Ltd., Suwon-Si, Gyeonggi-do (KR)

(72) Inventors: Chin Woo Kim, Hwaseong-si (KR); Jin Ha Kim, Yongin-si (KR); Sang Woo Ha, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/056,339

(22) Filed: Oct. 17, 2013

(65) Prior Publication Data

US 2014/0203315 A1    Jul. 24, 2014

(30) Foreign Application Priority Data

Jan. 23, 2013    (KR) ........................ 10-2013-0007661

(51) Int. Cl.
| | | |
|---|---|---|
| *H01L 33/00* | (2010.01) | |
| *H01L 33/58* | (2010.01) | |
| *G02B 19/00* | (2006.01) | |
| *F21V 5/04* | (2006.01) | |
| *F21V 7/00* | (2006.01) | |

(52) U.S. Cl.
CPC ............ *H01L 33/58* (2013.01); *G02B 19/0028* (2013.01); *G02B 19/0061* (2013.01); *F21V 5/04* (2013.01); *F21V 7/0091* (2013.01); *F21V 2101/02* (2013.01)
USPC ......................................................... 257/98

(58) Field of Classification Search
CPC ....... H01L 33/18; H01L 33/62; H01L 33/405; H01L 33/465; H01L 33/486; H01L 33/52; H01L 33/642

USPC ............................................ 257/92–100, 676
See application file for complete search history.

(56) References Cited

U.S. PATENT DOCUMENTS

| 7,187,501 | B2 | 3/2007 | Wakisaka | |
|---|---|---|---|---|
| 8,042,975 | B2 | 10/2011 | Shyu et al. | |
| 2010/0207140 | A1 | 8/2010 | Rudaz et al. | |
| 2012/0176801 | A1 | 7/2012 | You | |
| 2013/0049049 | A1* | 2/2013 | Choi ................................ 257/98 |
| 2013/0223081 | A1* | 8/2013 | Jiang et al. ..................... 362/327 |

FOREIGN PATENT DOCUMENTS

| JP | 2006-227531 A | 8/2006 |
|---|---|---|
| KR | 10-0576864 | 10/2005 |
| KR | 10-2010-0065607 A | 6/2010 |
| KR | 10-2011-0005127 A | 1/2011 |
| KR | 10-1150713 | 6/2011 |
| KR | 10-2012-0066455 A | 6/2012 |

* cited by examiner

*Primary Examiner* — Brook Kebede
(74) *Attorney, Agent, or Firm* — McDermott Will & Emery LLP

(57) ABSTRACT

A light emitting diode (LED) lens comprises a light incident surface on a bottom surface of the LED lens facing a light source. A light exit surface, having a size greater than the bottom surface, is defined by a top surface of the LED lens. A planar portion, emitting light incident through the light incident surface, is in a central region of the light exit surface. At least one protrusion portion, protruding to be stepped with respect to the planar portion, is in a region of the light exit surface except for the central region. A reflective surface, defined by lateral surfaces of the LED lens between the top surface of the LED lens and the bottom surface thereof, guides the light incident through the light incident surface, and contacts a lower portion of the light exit surface corresponding to a boundary between the protrusion and the planar portions.

20 Claims, 6 Drawing Sheets

LED LENS AND LED PACKAGE USING THE SAME

CROSS-REFERENCE TO RELATED APPLICATION

This application claims the benefit of priority to Korean Patent Application No. 10-2013-0007661, filed on Jan. 23, 2013, in the Korean Intellectual Property Office, the disclosure of which is incorporated herein by reference in its entirety.

TECHNICAL FIELD

The present application relates to a light emitting diode (LED) lens and an LED package using the same.

BACKGROUND

A semiconductor light emitting device such as a light emitting diode (LED), a device including materials emitting light through the application of electrical energy thereto, may convert energy generated through the recombination of electrons and electron holes in a junction semiconductor into light to be emitted. Light emitting diodes are widely used in lighting devices and display devices and as lighting sources, and the development thereof has, therefore, been accelerated.

In particular, recently, the development and employment of gallium nitride-based LEDs (gallium nitride-based semiconductor light emitting devices) has increased, and camera flashes, mobile device keypads, vehicle turn signal lamps, and the like, using such a gallium nitride-based LED, have been commercialized, and, in line with this, the development of general illumination devices using LEDs has accelerated.

In general, in line with the popularity of digital cameras, small-sized digital cameras are commonly embedded in mobile communications terminals, such as mobile phones. Such digital cameras and cameras for mobile communications terminals are provided with built-in flashes for providing a quantity of light required for night photography.

As the use of LEDs has extended to camera flashes, an LED lens that allows light from LEDs to be emitted at an orientation angle and an angle of view appropriate for photography is attached to the LEDs.

Since such LED lenses are mass produced, demand for improving productivity in the production of LED lenses has increased.

SUMMARY

An aspect of the disclosure provides a light emitting diode (LED) lens allowing for a reduction in adhesion between LED lenses in a manufacturing process thereof and an LED package using the same.

According to an aspect of the disclosure, there is provided a light emitting diode (LED) lens comprising a light incident surface on a bottom surface of the LED lens facing a light source. A light exit surface, having a size greater than that of the bottom surface, is defined by a top surface of the LED lens. A planar portion, emitting light incident through the light incident surface, is formed in a central region of the light exit surface. At least one protrusion portion, protruding so as to be stepped with respect to the planar portion, is formed in at least one region of the light exit surface except for the central region. A reflective surface, defined by lateral surfaces of the LED lens between the top surface of the LED lens and the bottom surface thereof, guides the light incident through the light incident surface, and contacts a lower portion of the light exit surface corresponding to a boundary between the protrusion portion and the planar portion.

The protrusion portion may have a surface parallel to the planar portion.

The surface of the protrusion portion may be uneven.

The protrusion portion may have an area equal to or less than 25% that of the light exit surface.

The at least one protrusion portion may include a plurality of protrusion portions.

The plurality of protrusion portions may have different heights.

The protrusion portion may have a height of 20 μm to 100 μm.

The protrusion portion may have an inclined surface having a slope.

The plurality of protrusion portions may be formed to be horizontally or vertically symmetrical with respect to each other based on the central region.

The reflective surface may be formed such that the light incident through the light incident surface is substantially totally reflected.

The top surface and the bottom surface of the LED lens may be respectively provided as quadrangles having the same ratio between sides thereof.

The planar portion may be formed to have at least one of a quadrangular shape, a circular shape, and an elliptical shape, when the light exit surface is viewed from the above.

According to another aspect of the disclosure, there is provided an LED package comprising a package body including a chip mounting area surrounded by lateral sides thereof. An LED is mounted on the chip mounting area. An LED lens disposed on the LED and includes lateral surfaces surrounded by the lateral sides of the package body. The LED lens includes a light incident surface on a bottom surface of the LED lens facing a light source. A light exit surface, having a size greater than that of the bottom surface, is defined by a top surface of the LED lens. A planar portion, emitting light incident through the light incident surface, is formed in a central region of the light exit surface. At least one protrusion portion, protruding so as to be stepped with respect to the planar portion, is formed in at least one region of the light exit surface except for the central region. A reflective surface, defined by lateral surfaces of the LED lens between the top surface of the LED lens and the bottom surface thereof, guides the light incident through the light incident surface, and contacts a lower portion of the light exit surface corresponding to a boundary between the protrusion portion and the planar portion.

The LED lens may comprise a silicone resin or an epoxy resin.

The protrusion portion may have an area equal to or less than 25% of an area of the light exit surface.

According to another aspect of the disclosure, there is provided an LED package comprising a package body including a chip mounting area surrounded by opposing lateral sides thereof. An LED is mounted on the chip mounting area. An LED lens is disposed on the LED. The LED lens includes a light incident surface on a bottom surface of the LED lens facing a light source. A light exit surface is defined by a top surface of the LED lens. A planar portion, emitting light incident through the light incident surface, is formed in the light exit surface. A protrusion portion substantially completely surrounding the planar portion, protrudes so as to be stepped with respect to the planar portion. A reflective surface is defined by lateral surfaces of the LED lens between the top surface of the LED lens and the bottom surface thereof.

The reflective surface of the LED package may be arc-shaped when viewed in cross-section.

The LED may comprise a nitride semiconductor device that emits light in a wavelength of 300 nm to 460 nm.

The package body may comprise a first lead frame and a second lead frame, and the LED is wire bonded to the first and second lead frames.

The surfaces of the first and second lead frames may comprise a reflective metal selected from the group consisting of: Ag, Ni, Al, Rh, Pd, Ir, Ru, Mg, Zn, Pt, and Au.

BRIEF DESCRIPTION OF THE DRAWINGS

The above and other aspects, features and other advantages will be more clearly understood from the following detailed description taken in conjunction with the accompanying drawings.

DETAILED DESCRIPTION

Figure 1:
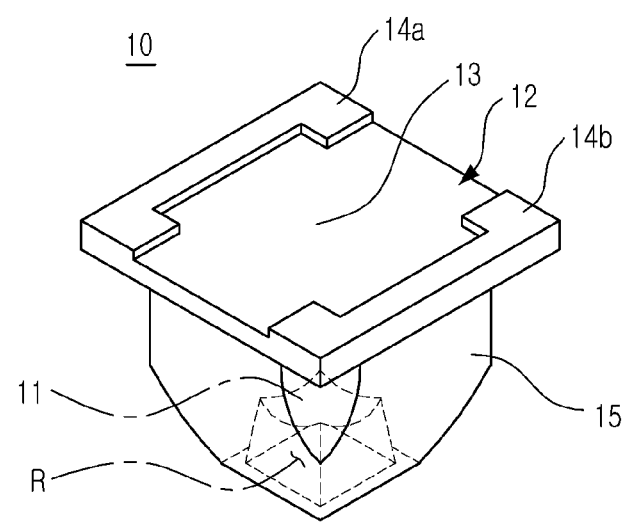
FIG. 1 is a perspective view of a light emitting diode (LED) lens according to an embodiment of the disclosure.

Hereinafter, embodiments will be described in detail with reference to the accompanying drawings. The embodiments may, however, be embodied in many different forms and should not be construed as being limited to the embodiments set forth herein. Rather, these embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

An LED package 100 according to an embodiment is used as a camera flash by way of example. However, the LED package 100 is not limited thereto. The LED package 100 may be applied to various types of illumination device.

Figure 2:
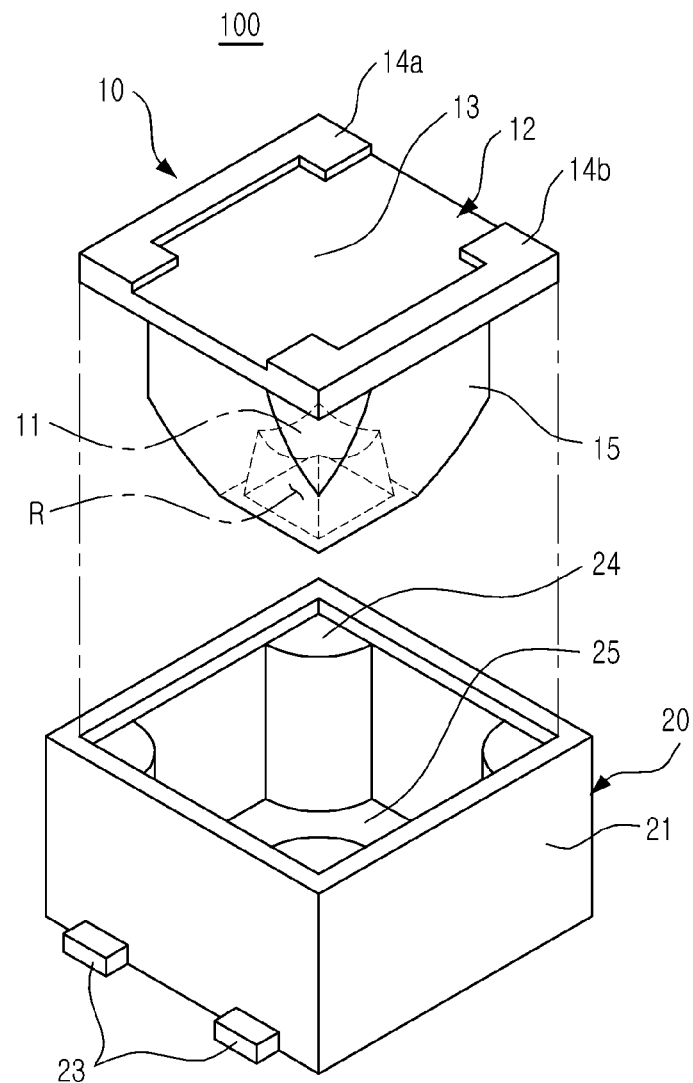
FIG. 2 is a partially exploded perspective view of an LED package according to an embodiment of the disclosure.
Figure 3:
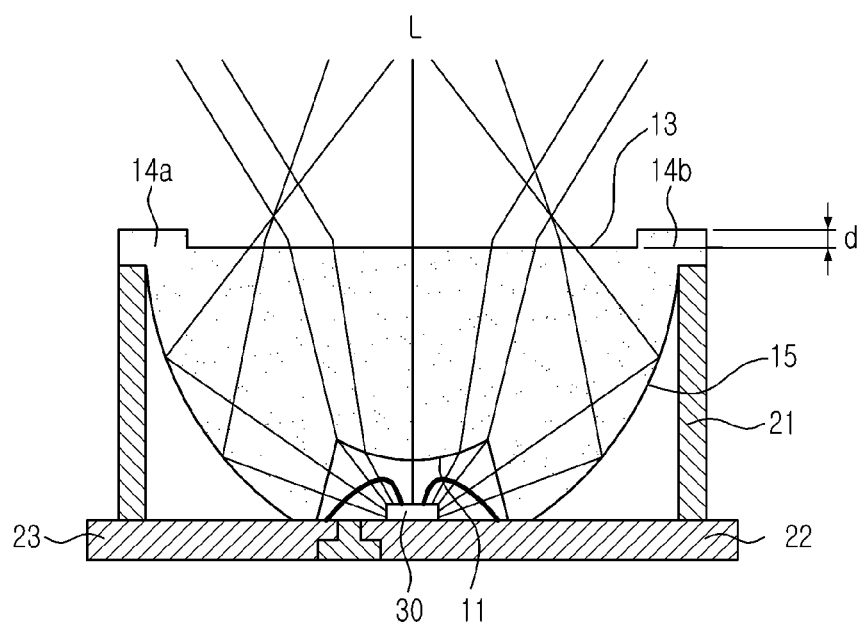
FIG. 3 is a side cross-sectional view of the LED package of FIG. 2.

FIG. 1 is a perspective view of a light emitting diode (LED) lens according to an embodiment of the disclosure. FIG. 2 is a partially exploded perspective view of an LED package according to an embodiment. FIG. 3 is a side cross-sectional view of the LED package of FIG. 2. Referring to FIGS. 2 and 3, the LED package 100 according to the embodiment may include a package body 20, an LED 30, and an LED lens 10.

As illustrated in FIG. 1, the LED lens 10 may include a light incident surface 11, a light exit surface 12, a planar portion 13, protrusion portions 14a, 14b, and a reflective surface 15. In certain embodiments, the LED lens 10 may be formed of a plastic or a silicone. Specifically, the LED lens 10 may be formed of a silicone resin or an epoxy resin, capable of avoiding yellowing thereof caused by heat during a high temperature packaging process.

The light incident surface 11, a region facing a light source such as the LED 30, may be formed on a bottom surface of the lens 10. The light incident surface 11 may correspond to a portion of the LED lens 10 on which light emitted from the LED 30 initially arrives. The light incident surface 11 may be defined as an internal surface of a recess R formed on the bottom surface of the LED lens 10.

The recess R may be formed to be recessed from the quadrangular bottom surface of the LED lens 10 in a position corresponding to the LED 30. A space formed by the recess R has the LED 30 received therein. In this case, the internal surface of the recess R may include lateral surfaces and top surfaces. Specifically, the recess R may have a quadrangular shape when viewed from the light exit surface 12, and may have dimensions and height sufficient to receive the LED 30 therein.

The lateral surfaces of the light incident surface 11 may include four lateral surfaces corresponding to the bottom surface of the LED lens 10 formed as a quadrangle.

The top surfaces of the light incident surface 11 may have a convex lens shape towards the LED 30.

The light exit surface 12 is defined by a top surface of the LED lens 10 having a size greater than that of the bottom surface thereof, and has a quadrangular shape. The light exit surface 12 may be disposed to be opposite to the bottom surface of the LED lens 10. The light exit surface 12 may be positioned in a top portion of the LED lens 10, opposite to the bottom surface thereof and entirely formed as a planar surface. Specifically, the light exit surface 12 may have a rectangular shape or a square shape. In the case in which the recess R is formed in a bottom of the LED lens 10, the light exit surface 12 may have a quadrangular shape the same as that of the recess R.

The light exit surface 12 may include the planar portion 13 formed in a central region thereof. The planar portion 13, a region from which light incident through the light incident surface 11 is emitted, may be parallel to a surface of the LED package 100 on which the LED 30 is mounted.

Protrusion portions 14a, 14b may be formed on regions of the light exit surface 12, except for the central region thereof. The protrusion portions 14a, 14b may be formed on the light exit surface 12 of the LED lens 10 in order to prevent the light exit surface 12 of one LED lens 10 from being adhered to the light exit surface 12 of another LED lens 10. The protrusion portions 14a, 14b may be formed in a single region of the light exit surface 12; but may also be formed in a plurality of regions thereof. An example in which the protrusion portions 14a, 14b are formed in two regions of the light exit surface 12 is illustrated in FIG. 1.

The protrusion portions 14a, 14b may protrude so as to be stepped with respect to the planar portion 13. The protrusion portions 14a, 14b may have surfaces parallel to the planar portion 13, and may also have inclined surfaces having a slope.

Figure 6A:
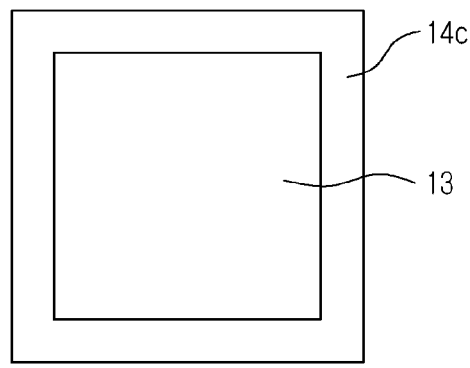
FIGS. 6A and 6B are plan views respectively illustrating a modified example of the LED lens of FIG. 1.
Figure 6B:
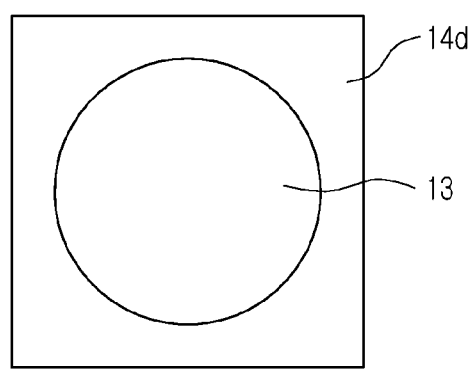

In addition, as illustrated in FIGS. 6A and 6B, the protrusion portions 14c and 14d may be formed in a single region and may be separately formed in a plurality of regions. In other embodiments, the protrusion portions separately formed in the plurality of regions may be protruded to have different heights. When the plurality of protrusion portions are formed to have different heights, because one of the protrusion portions is not adhered to a member in spite of the adhesion of the other protrusion portion, the possibility that LED lenses may be adhered to each other may be lowered, and the LED lenses may be more easily separated from each other even when temporarily adhered to each other.

In addition, surfaces of the protrusion portions may be formed to be uneven or to have roughness, such that adhesion between the protrusion portions may be further reduced.

The protrusion portions may have an area equal to or less than 25% of an area of the light exit surface. When protrusion portions have an area greater than 25% of the area of the light exit surface, the planar portion 13 may have an excessively reduced area, resulting in deteriorated light extraction efficiency. Specifically, when the light exit surface 12 has an area of 0.5 mm×0.5 mm, for example, the protrusion portions 14a, 14b, 14c, 14d may be formed to have an area equal to or smaller than 0.0625 mm² corresponding to 25% of 0.25 mm², the area of the light exit surface 12.

Further, the protrusion portions 14a, 14b, 14c, 14d may have a step height of 20 μm to 100 μm with respect to the planar portion 13. When the protrusion portions 14 a, 14b, 14c, 14d and the planar portion 13 have a step height less than 20 μm, the light exit surfaces 12 of LED lenses may be adhered to each other due to surface adhesive force acting on the light exit surfaces 12. When the protrusion portions 14 a, 14b, 14c, 14d and the planar portion 13 have a step height greater than 100 μm, a portion of light angularly emitted through the planar portion 13 may be covered by the protrusion portions 14. Thus, an irradiation angle of the emitted light may be reduced.

When a plurality of protrusion portions are provided, the plurality of protrusion portions may be formed to be horizontally or vertically symmetrical with respect to each other based on the central region of the planar portion. Such the protrusion portions may prevent the light exit surface of one LED lens from being adhered to the light exit surface of another LED lens in the manufacturing process of the LED lens and the LED package. This will hereinafter be described in detail.

Recently, LED packages have commonly been produced using surface mount technology (SMT) in order to reduce weight and thickness. In the surface mount technology (SMT), a production process is conducted in high temperature environments of 260° C. or above. Thus, in order to resist high temperature environments, the LED lens is manufactured using highly thermostable silicone resin or epoxy resin. However, because silicone resin or epoxy resin is highly thermostable and also highly adhesive, adherence of the light exit surface 12 of one LED lens 10 to the light exit surface 12 of another LED lens 10 has frequently occurred in the manufacturing process.

Figure 4A:
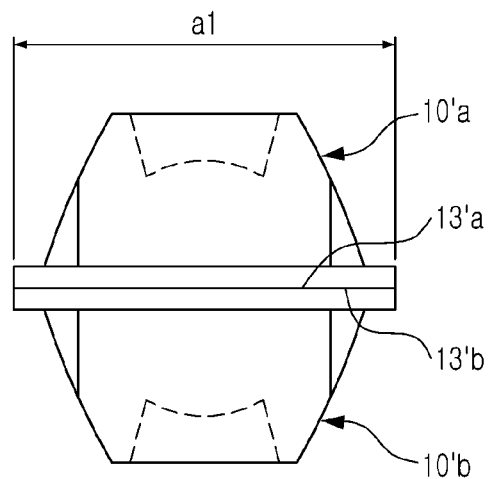
FIGS. 4A and 4B are views respectively illustrating a comparison example of a phenomenon in which the LED lenses of FIG. 1 are adhered to each other.
Figure 4B:
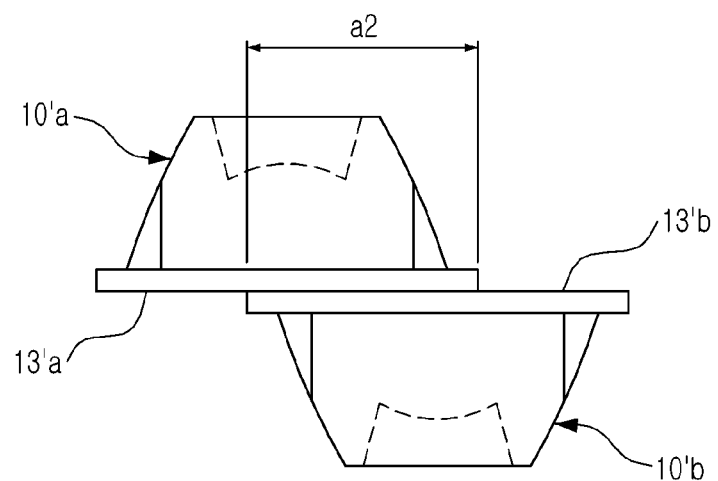

FIGS. 4A and 4B are views respectively illustrating a state in which the LED lenses 10 are adhered to each other.

FIG. 4A illustrates the case in which a light exit surface 13'a of an LED lens 10'a is attached to a light exit surface 13'b of an LED lens 10'b, such that the entire surfaces a1 thereof are completely overlapped with each other. FIG. 4B illustrates the case in which a light exit surface 13'a of an LED lens 10'a is attached to a light exit surface 13'b of an LED lens 10'b such that partial surfaces a2 thereof are overlapped with each other. In either case, it may be necessary to manually separate the light exit surfaces of the LED lenses one by one, causing a reduction in productivity. In addition during the separation of the LED lenses 10, the light exit surface 12 of the LED lens 10 may be damaged.

In order to overcome the defect of the light exit surface 12 adhering to the light exit surface 12 of another LED lens 10, the protrusion portions 14a, 14b, 14c, 14d may be formed on the light exit surface 12 of the LED lens 10. Since the protrusion portions 14a, 14b, 14c, 14d may have a narrow area as compared to the light exit surface 12, adhesive force formed by the protrusion portions 14 is relatively small. Thus, the light exit surfaces 12 of the LED lenses 10 may be prevented from adhering to each other.

Figure 5A:
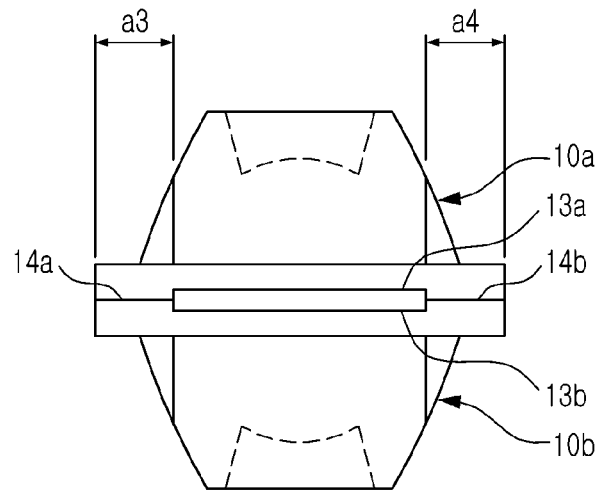
FIGS. 5A and 5B are views respectively illustrating an inventive example of a phenomenon in which the LED lenses of FIG. 1 are adhered to each other.
Figure 5B:
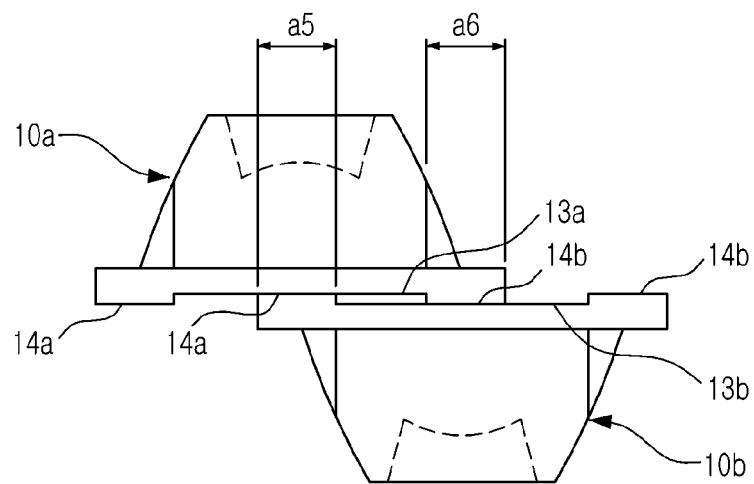

Further, although the protrusion portions 14a, 14b of one LED lens 10 may be adhered to the protrusion portions 14a, 14b of another LED lens 10, the protrusion portions 14a, 14b may be easily separated from each other. As illustrated in FIGS. 5A and 5B, even in the case of LED lenses 10a, 10b being provided with the protrusion portions 14a, 14b, the protrusion portions 14a, 14b of the LED lens 10a may be temporarily adhered to the protrusion portions 14a, 14b of the LED lens 10b in the manufacturing process thereof.

FIG. 5A illustrates the case in which the protrusion portions 14a, 14b of the LED lenses 10a, 10b are adhered to each other, and FIG. 5B illustrates the case in which the protrusion portion 14a, 14b and a planar portion 13a, 13b of the LED lenses 10a, 10b are adhered to each other. Even in the case of being temporarily adhered, since the area of the protrusion portions 14a, 14b is relatively narrow as compared to the overall area of the light exit surface 12, the contact area of the adhered LED lenses may be small as compared to the case of LED lenses having no protrusion portions. The contact area may be small, such that the LED lenses 10a, 10b may be separated from each other by applying small impacts thereto during the manufacturing process. Thus, even when the LED lenses are adhered to each other during the manufacturing process, they can be easily separated from each other according to the present disclosure.

The reflective surface 15 is defined by lateral surfaces of the LED lens 10 between the top surface of the LED lens 10 and the bottom surface thereof and guides light incident through the light incident surface 11 to the light exit surface 12. The reflective surface 15 may be formed to contact a lower portion of the light exit surface 12 corresponding to a boundary between the protrusion portions 14a, 14b and the planar portion 13. In this manner, when the reflective surface 15 is formed to contact the boundary between the protrusion portions 14 and the planar portion 13, light incident into the LED lens 10 through the light incident surface 11 may only be emitted through the planar portion 13. The protrusion portions 14 may be formed in regions having no influence on external light extraction.

Specifically, the reflective surface 15 is formed by connecting the lower portion of the light exit surface 12 corresponding to the boundary between the protrusion portions 14 and the planar portion 13 to respective edges of the bottom surface. For example, as shown in FIG. 1, the reflective surface 13 may include lateral surfaces connecting the lower portion of the light exit surface 12 corresponding to the boundary between the protrusion portions 14 and the planar portion 13 to the rectangular bottom surface.

The reflective surface 15 may be formed as a curved surface such that incident light is emitted through the light exit surface 12 through total reflection without the loss of light. In this manner, the light from the LED 30 may be directed toward the light exit surface 12 through total reflection without the loss of light, and thus, it may be irradiated within a range corresponding to an imaging area having the quadrangular shape.

As the LED 30 mounted on a mounting surface 25 of the package body 20, any light emitting device may be used as long as it may emit light at the time of applying an electrical signal thereto, for example, an LED. Representatively, a semiconductor light emitting device formed by epitaxial growth of a semiconductor layer on a growth substrate may be used. As the growth substrate, sapphire may be used, but the present application is not limited thereto. For example, a growth substrate commonly known in the art, such as spinel, SiC, GaN, GaAs or the like may be used. Specifically, the LED 30 may be formed of BN, SiC, ZnSe, GaN, InGaN, InAlGaN, AlGaN, BAlGaN, BInAlGaN or the like, and may be doped with Si, Zn, or the like. In addition, a light emitting layer of the LED 30 may be formed of a nitride semiconductor including a composition of $In_xAl_yGa_{1-x-y}N$ ($0 \leq X \leq 1$, $0 \leq Y \leq 1$, $0 \leq X+Y \leq 1$), and may have a single or multi-quantum well structure to allow for improvements in output. In this case, the LED 30 may be formed of a nitride semiconductor device that emits light in a single wavelength of 300 nm to 460 nm such that the emitted light is converted into white light due to a wavelength conversion material such as a fluorescent substance or quantum dots.

As illustrated in FIG. 3, the LED 30 may be wire bonded to first and second lead frames 22 and 23 to receive an electrical signal applied from the outside. In this embodiment, the case in which the LED 30 is wire bonded to the respective first and second lead frames 22 and 23 through electrodes formed on a top surface thereof is illustrated. However, the detailed connecting method may be variously modified as needed, for example, a method of directly connecting the LED to the first lead frame 22 provided as a mounting area of the LED 30 without wires and connecting the LED to the second lead frame 23 with a conductive wire. In addition, the embodiment illustrates that a single LED 30 is provided in a single LED package 100; however, at least two LEDs 30 may be provided on a single lead frame 22.

Referring to FIGS. 2 and 3, the first and second lead frames 22 and 23 according to the embodiment may be provided as a mounting area of the LED 30 and at the same time, serve as terminals for applying an electrical signal supplied from the outside to the LED 30. To this end, the first and second lead frames 22 and 23 may be formed of a metal having excellent electrical conductivity and electrically insulated from each other in order to implement electrical connection. The first and second lead frames 22 and 23 may be surface-plated with silver (Ag), gold (Au), palladium (Pd), rhodium (Rh) or the like, in order to prevent the corrosion of metal.

Further, surfaces of the first and second lead frames 22 and 23 may be smoothly processed in order to improve surface reflectance and increase luminance. A highly reflective metal, for example, Ag, Ni, Al, Rh, Pd, Ir, Ru, Mg, Zn, Pt, Au or the like, may be used for the surfaces of the lead frames 22 and 23.

As set forth above, according to embodiments of the invention, a phenomenon in which LED lenses are adhered to each other during manufacturing processes of an LED lens and an LED package can be reduced.

While the present invention has been shown and described in connection with the embodiments, it will be apparent to those skilled in the art that modifications and variations can be made without departing from the spirit and scope of the present inventive concept as defined by the appended claims.

What is claimed is:

1. A light emitting diode (LED) lens, comprising:
   a light incident surface on a bottom surface of the LED lens facing a light source;
   a light exit surface, having a size greater than that of the bottom surface, defined by a top surface of the LED lens;
   a planar portion, emitting light incident through the light incident surface, formed in a central region of the light exit surface;
   at least one protrusion portion, protruding so as to be stepped with respect to the planar portion, formed in at least one region of the light exit surface except for the central region; and
   a reflective surface, defined by lateral surfaces of the LED lens between the top surface of the LED lens and the bottom surface thereof, guiding the light incident through the light incident surface, and contacts a lower portion of the light exit surface corresponding to a boundary between the protrusion portion and the planar portion.

2. The LED lens of claim 1, wherein the protrusion portion has a surface parallel to the planar portion.

3. The LED lens of claim 2, wherein the surface of the protrusion portion is uneven.

4. The LED lens of claim 1, wherein the protrusion portion has an area equal to or less than 25% of an area of the light exit surface.

5. The LED lens of claim 1, wherein the at least one protrusion portion includes a plurality of protrusion portions.

6. The LED lens of claim 5, wherein the plurality of protrusion portions have different heights.

7. The LED lens of claim 1, wherein the protrusion portion has a height of 20 μm to 100 μm.

8. The LED lens of claim 1, wherein the protrusion portion has an inclined surface having a slope.

9. The LED lens of claim 5, wherein the plurality of protrusion portions are formed to be horizontally or vertically symmetrical with respect to each other based on the central region.

10. The LED lens of claim 7, wherein the reflective surface is formed such that the light incident through the light incident surface is substantially totally reflected.

11. The LED lens of claim 1, wherein the top surface and the bottom surface of the LED lens are respectively provided as quadrangles having a same ratio between sides thereof.

12. The LED lens of claim 1, wherein the planar portion has at least one of a quadrangular shape, a circular shape, and an elliptical shape, when the light exit surface is viewed from the above.

13. An LED package, comprising:
   a package body including a chip mounting area surrounded by lateral sides thereof;
   an LED mounted on the chip mounting area; and
   an LED lens disposed on the LED and including lateral surfaces surrounded by the lateral sides of the package body,
   wherein the LED lens includes:
      a light incident surface on a bottom surface of the LED lens facing a light source;
      a light exit surface, having a size greater than that of the bottom surface, defined by a top surface of the LED lens;
      a planar portion, emitting light incident through the light incident surface, formed in a central region of the light exit surface;
      at least one protrusion portion, protruding so as to be stepped with respect to the planar portion, formed in at least one region of the light exit surface except for the central region; and
      a reflective surface, defined by lateral surfaces of the LED lens between the top surface of the LED lens and the bottom surface thereof, guiding the light incident through the light incident surface, and contacts a lower portion of the light exit surface corresponding to a boundary between the protrusion portion and the planar portion.

14. The LED package of claim 13, wherein the LED lens comprises a silicone resin or an epoxy resin.

15. The LED package of claim 13, wherein the protrusion portion has an area equal to or less than 25% of an area of the light exit surface.

16. An LED package, comprising:
   a package body including a chip mounting area surrounded by opposing lateral sides thereof;

an LED mounted on the chip mounting area; and
an LED lens disposed on the LED,
wherein the LED lens includes:
- a light incident surface on a bottom surface of the LED lens facing a light source;
- a light exit surface defined by a top surface of the LED lens;
- a planar portion, emitting light incident through the light incident surface, formed in the light exit surface;
- a protrusion portion substantially completely surrounding the planar portion, protruding so as to be stepped with respect to the planar portion; and
- a reflective surface defined by lateral surfaces of the LED lens between the top surface of the LED lens and the bottom surface thereof.

17. The LED package of claim 16, wherein the reflective surface is arc-shaped when viewed in cross-section.

18. The LED package of claim 16, wherein the LED comprises a nitride semiconductor device that emits light in a wavelength of 300 nm to 460 nm.

19. The LED package of claim 16, wherein the package body further comprises a first lead frame and a second lead frame, and the LED is wire bonded to the first and second lead frames.

20. The LED package of claim 19, wherein surfaces of the first and second lead frames comprise a reflective metal selected from the group consisting of: Ag, Ni, Al, Rh, Pd, Ir, Ru, Mg, Zn, Pt, and Au.

\* \* \* \* \*